(12) United States Patent
Beaulaton et al.

(10) Patent No.: US 7,605,652 B2
(45) Date of Patent: Oct. 20, 2009

(54) LOOP GAIN EQUALIZER FOR RF POWER AMPLIFIER

(75) Inventors: Hugues Beaulaton, Toulouse (FR); Gerald Haennig, Toulouse (FR); Didier Salle, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 64 days.

(21) Appl. No.: 12/063,012

(22) PCT Filed: Aug. 5, 2005

(86) PCT No.: PCT/EP2005/010047

§ 371 (c)(1),
(2), (4) Date: Feb. 5, 2008

(87) PCT Pub. No.: WO2007/016967

PCT Pub. Date: Feb. 15, 2007

(65) Prior Publication Data

US 2008/0211575 A1  Sep. 4, 2008

(51) Int. Cl.
*H03G 3/20* (2006.01)
(52) U.S. Cl. ...................................... 330/141
(58) Field of Classification Search ............. 330/141, 330/280, 281
See application file for complete search history.

(56) References Cited

U.S. PATENT DOCUMENTS

| 4,371,842 | A * | 2/1983 | Lee ........................... 330/141 |
| 5,138,277 | A * | 8/1992 | Robinson et al. ........... 330/281 |
| 6,677,823 | B2 | 1/2004 | Terosky et al. |
| 6,801,784 | B1 | 10/2004 | Rozenblit et al. |
| 2004/0176049 | A1 | 9/2004 | Nagode et al. |
| 2004/0266371 | A1 | 12/2004 | Summers et al. |

FOREIGN PATENT DOCUMENTS

| EP | 1484839 A1 | 12/2004 |
| WO | 9530275 A1 | 11/1995 |

OTHER PUBLICATIONS

Wong et al; "A 2.7-5.5 V, 0.2-1 W BiCMOS RF driver amplifier IC with closed-loop power control and biasing functions" IEEE Journal of Solid-State Circuits, vol. 33, Issue 12, Dec. 1998 pp. 2259-2264.

* cited by examiner

*Primary Examiner*—Steven J Mottola

(57) ABSTRACT

The output power of an RF power amplifier is controlled using a feedback loop including a differential integrator for controlling the amplifier's bias voltage. The gain of integration in the differential integrator is varied so as to compensate for variations in the derivative of the power amplifier output power versus the bias voltage.

20 Claims, 3 Drawing Sheets

−PRIOR ART−

−PRIOR ART−

LOOP GAIN EQUALIZER FOR RF POWER AMPLIFIER

The present invention relates to the field of RF power amplification and, more particularly, to an RF power amplifier whose output power level is controlled via a bias control loop.

In a radio transmitter it is desirable to be able to control, accurately, the power of the transmitted RF signal so that at any given time it takes a desired value (for example, a value set by a user). In particular, it is desired to avoid fluctuations in output power caused by variations in the frequency of the signal and/or variations in temperature. Generally, the power of the transmitted RF signal is controlled to the set value by using a feedback loop to control the output power of an RF amplifier used in the transmitter. More particularly, the power of the output RF signal is measured and compared with a reference signal so as to produce a difference signal ("error signal"). The error signal is used to control, automatically, the behaviour of the amplifier.

Two main techniques are used for controlling the RF amplifier's output power:

a) controlling the power at the input to the amplifier by varying the attenuation applied by a voltage-controlled attenuator provided at the amplifier input—known as an input power control mode (IPCM), or b) controlling the gain implemented by the amplifier by controlling the amplifier's bias circuit—known as a bias control mode (BCM).

An IPCM approach has the advantage that it simplifies the design of the feedback loop. However, in an IPCM architecture the amplifier applies a maximum gain at all times, which can lead to inefficiency (i.e. in the case where the output power required is not maximum).

Amplifiers that use a BCM architecture for achieving accurate control of output power are efficient insofar that, if a low output power is required, the amplifier gain can be controlled to a low value. However, it can be difficult to achieve a stable loop configuration in view of the transfer function between the biasing voltage, Vbias, and the RF output power, and in view of the typical dynamic range it is desired to accommodate. This problem can be better understood from a consideration of the conventional BCM power amplifier architecture illustrated schematically in FIG. 1.

As shown in FIG. 1, in the conventional BCM architecture an RF power amplifier 1 receives a modulated RF signal, $RF_{in}$, having a power level $P_{in}$, and produces at its output an amplified modulated RF signal, $RF_{out}$ having a power level $P_{out}$. The power amplifier 1 can have any desired number of stages of amplification (FIG. 1 illustrates a power amplifier having three stages of amplification). A coupler 2 samples the amplifier's output signal $RF_{out}$ and supplies a signal representative of $RF_{out}$ to a power detector 3. The power detector 3 produces an output signal $V_{det}$ representative of $P_{out}$ and supplies this signal to a differential integrator 4.

In this differential integrator circuit 4, it can be considered that there is a notional adder 6 which subtracts the signal $V_{det}$ from a reference signal $V_{ref}$ and produces an output signal, $V_{error}$, indicative of the difference. This difference signal, $V_{error}$, is fed to a notional integrator 7. In practice, the differential integrator circuit 4 is generally implemented as a single device which performs the functions of the notional adder 6 and notional integrator 7. The output from the differential integrator 4 is a signal $V_{bias}$ which is used to control the bias circuit 10 of the power amplifier 1. Accordingly, the gain applied by the RF power amplifier 1 is controlled depending on how close the power level $P_{out}$ of the output signal $RF_{out}$ is to a reference value (set by appropriate regulation of $V_{ref}$).

FIG. 2 is a circuit diagram showing a conventional differential integrator 4a based on an operational amplifier. An integrator of this type is often used in a BCM architecture such as that of FIG. 1.

The BCM loop approach is used in many radio transmitter applications. In theory, it should be possible to set the output power level within a wide dynamic range using this configuration. However, in order to ensure that the loop is stable it is necessary to ensure that the loop phase margin remains at an acceptable value. The phase margin depends on the frequency location of the open loop unity gain. However, the frequency at which open loop unity gain is achieved varies according to the loop biasing.

The open-loop transfer function, $H_{ol}$, is the product of the transfer function, $H_{coup}$, of the coupler 2, the transfer function, $H_{det}$, of the power detector 3, the transfer function, $H_{int}$, of the differential integrator circuit 4 and the transfer function, $H_{pa}$, of the power amplifier, as defined in equation (1) below:

$$H_{ol}=H_{coup}H_{det}H_{int}H_{pa} \qquad (1)$$

Assuming that each of the coupler 2, (compensated) power detector 3 and differential integrator circuit 4 has a respective constant gain, then the overall open-loop gain ($K_{ol}$) will vary as the power amplifier gain ($K_{pa}$) varies. In other words:

$$\Delta K_{ol} \propto \Delta K_{pa} \qquad (2)$$

Now, it is the relationship (transfer function) between the power at the RF output and the amplifier's biasing voltage which determines the gain ($K_{pa}$) introduced by the power amplifier. FIG. 3A illustrates this relationship between $P_{out}$ and $V_{bias}$, whereas FIG. 3B illustrates the derivative of the relationship, in other words, how $\partial P_{out}/\partial V_{bias}$ (that is power amplifier gain $K_{pa}$) varies with the applied bias voltage, $V_{bias}$.

As it can be understood from FIG. 3, the power amplifier gain varies widely with the output power. This implies that there is a large variation in the bandwidth and phase margin of the feedback loop. Thus, it is difficult to find loop parameters which will provide stable operation of the feedback loop over the whole output power range.

Furthermore, FIG. 3 shows that, at high output powers, the gain introduced by the power amplifier is actually quite small. This dramatically reduces the bandwidth at high power, changing the dynamics of the feedback loop. In particular, the response of the feedback loop can become so sluggish that the RF output power level cannot match the time mask specified by the user (i.e. a required variation of output power with time cannot be achieved).

One way of addressing the above-mentioned problems is to increase the backoff, that is, to make a further reduction in the power actually outputted to the antenna (as compared with the amplifier's rated maximum possible output power). However, such an approach has the disadvantage of reducing the PAE (Power Added Efficiency).

It is desirable to develop a BCM power amplifier architecture which avoids the above-described problems associated with the prior art.

The present invention provides a method of controlling the output power of an RF power amplifier as set forth in the accompanying claims.

The present invention further provides an RF power amplifier as set forth in the accompanying claims.

The present invention yet further provides an RF transmitter as set forth in the accompanying claims.

According to the preferred embodiments of the invention the above-mentioned problems of a conventional BCM RF power amplifier architecture can be addressed by varying the gain of integration of a differential integrator circuit included in the BCM loop. The advantage of implementing the gain variation at this location within the overall architecture is that the desired variation can be achieved in a simple manner and without conflicting with other design requirements. Moreover, in certain embodiments of the invention the gain variation can be implemented without increasing the number of physical components in the differential integrator circuit.

Features and advantages of the present invention will become clear from the following description of preferred embodiments thereof, given by way of example, illustrated by the accompanying drawings, in which:

FIG. 3 shows graphs indicating how amplifier behaviour varies with the applied bias voltage in the conventional architecture of FIG. 1, in which:

A first preferred embodiment of the invention will now be described with reference to FIGS. 4 to 9.

Figure 4:
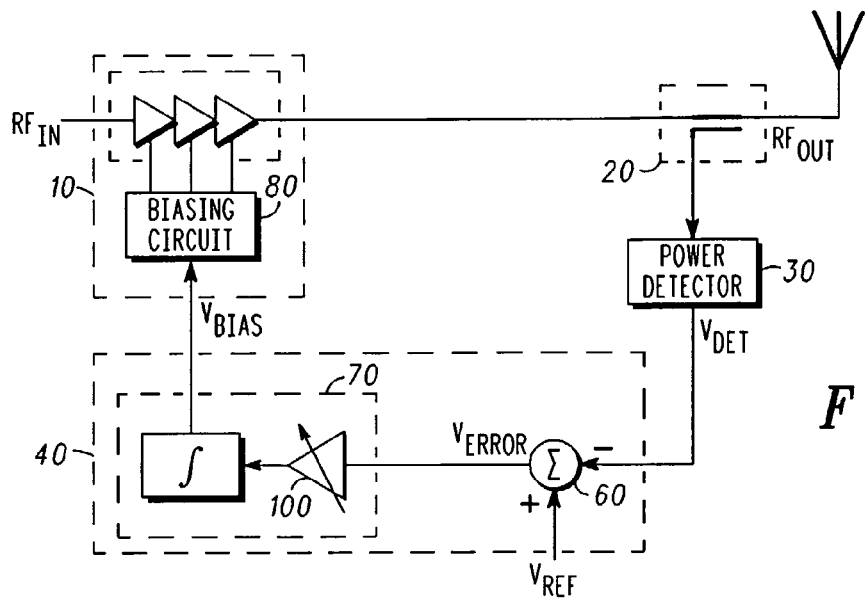
FIG. 4 is a block diagram schematically representing the main components of a bias control mode RF power amplifier architecture according to a first preferred embodiment of the present invention.

As shown in FIG. 4, according to the first preferred embodiment of the present invention, an RF power amplifier 10 receives a modulated RF signal, $RF_{in}$, having a power level $P_{in}$, and produces at its output an amplified modulated RF signal, $RF_{out}$ having a power level $P_{out}$. A coupler 20 samples the output signal $RF_{out}$ and supplies a signal representative of $RF_{out}$ to a power detector 30. The power detector 30 produces an output signal $V_{det}$ representative of $P_{out}$ and supplies this signal to a bias control circuit 40 which performs the functions of a differential integrator circuit.

In the bias control circuit 40, a comparator 60 subtracts the signal $V_{det}$ from a reference signal $V_{ref}$ and produces an output signal, $V_{error}$, indicative of the difference. This difference signal, $V_{error}$, is fed to an integrator 70. The output from the integrator 70 is a signal $V_{bias}$ which is used to control the bias circuit 80 of the power amplifier 10.

Figure 1:
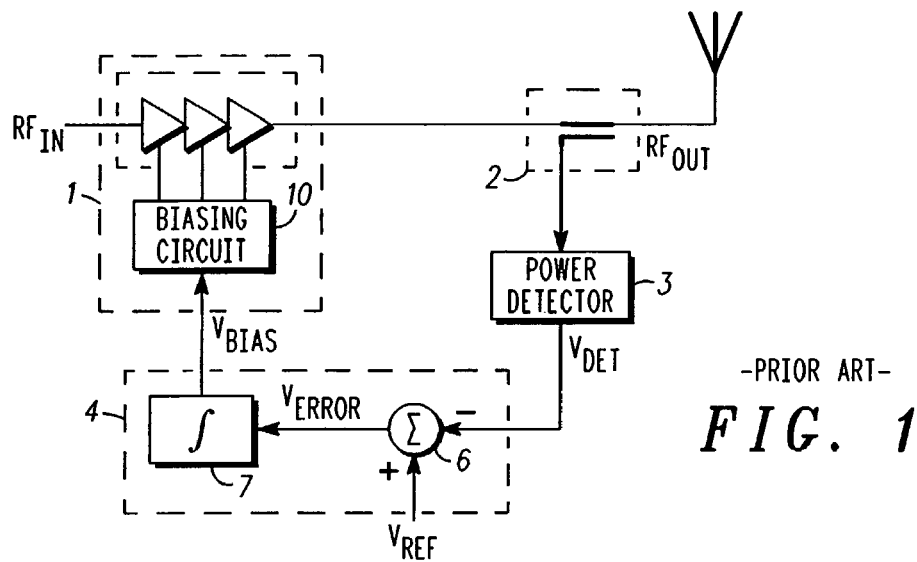
FIG. 1 is a block diagram schematically representing the main components of a conventional bias-control mode power amplifier architecture.

Once again, as in the conventional architecture of FIG. 1, the comparator 60 and integrator 70 may be notional devices that are actually implemented using a single differential integrator device, as shall be described in greater detail below. However, in the arrangement according to the first preferred embodiment of the invention, the gain of the differential integrator circuit 40 is variable (represented in FIG. 4 using the symbol for a variable amplifier 100). More particularly, the gain applied by the differential integrator circuit 40 is varied so as to compensate for variations in the derivative of the power amplifier output power level versus the biasing voltage. This is achieved by modulating the integrator gain using a coarse inverse function, that is, using a function approximating to $$K_x \left( \frac{\partial P_{out}}{\partial V_{bias}} \right)^{-1},$$

where $K_x$ is a constant gain. This approach overcomes the above-described problems associated with conventional BCM RF power amplifier architectures while significantly decreasing the amount of required backoff.

Figure 2:
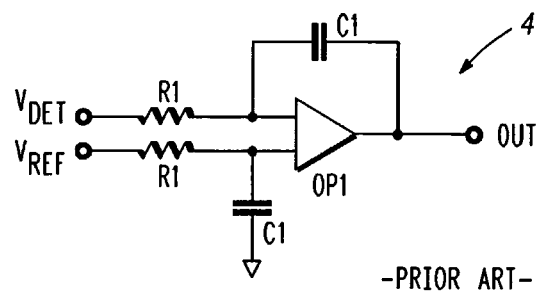
FIG. 2 is a circuit diagram illustrating the configuration of a conventional operational-amplifier-based differential integrator useable in the architecture of FIG. 1.
Figure 3A:
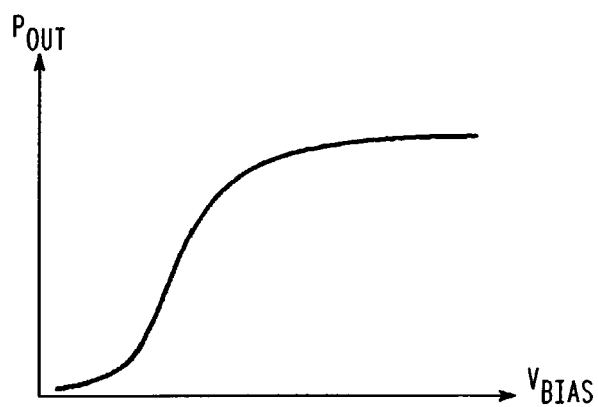
FIG. 3A shows how the amplifier output power varies with bias voltage.
Figure 3B:
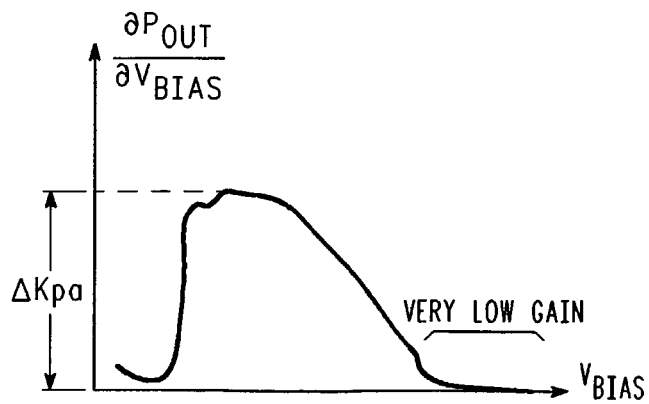
FIG. 3B shows how amplifier gain varies with the bias voltage.

The appropriate variation of integrator gain can be implemented in a variety of ways, depending on the differential integrator circuit's structure. For example, in the case where a differential integrator 40a having an operational-amplifier based structure of the kind shown in FIG. 2 is used, the required variation in the gain of integration can be achieved as explained below with reference to FIG. 5.

Figure 5:
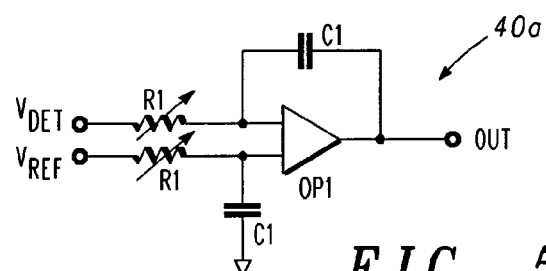
FIG. 5 is a circuit diagram illustrating the configuration of a modified operational-amplifier-based differential integrator useable in the architecture of FIG. 4.

FIG. 5 shows an operational-amplifier-based differential integrator structure 40a. The integral gain, $K_i$, of such an integrator is given by the following equation (4):

$$K_i = \frac{1}{R1 \times C1} \tag{3}$$

The integral gain of the differential integrator 40a is one of the factors that contribute to the overall open-loop gain $K_{ol}$. If the differential integrator's input resistance, R1, is decreased then $K_i$ increases and the overall open-loop gain $K_{ol}$ also increases. Decreasing R1, so as to increase open-loop gain $K_{ol}$, at high output power levels of the RF power amplifier leads to a compensation for the reduction of loop bandwidth that otherwise would have been observed at these power levels. Furthermore it simplifies the implementation of a stable loop.

In view of the fact that the power amplifier gain is not constant over the RF output power range, it is advantageous to set the value of the differential integrator's integral gain dynamically with a view to achieving the maximum phase margin. By adopting the approach proposed in the present invention it becomes possible to ensure loop stability while requiring a lower degree of backoff. In other words, the RF power amplifier can operate closer to its nominal maximum output power.

Figure 6:
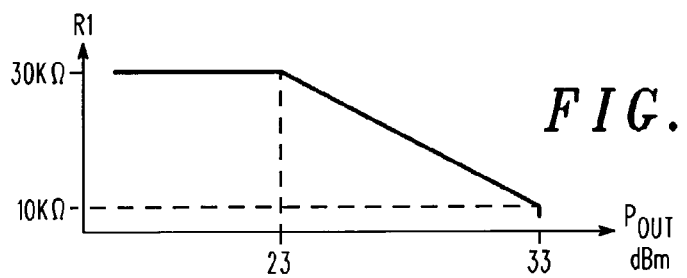
FIG. 6 is a graph showing one example of how the input resistance of the differential integrator of FIG. 5 can be varied in the first preferred embodiment of the invention.

FIG. 6 is a graph showing one example of how the input resistance, R1, of the differential integrator 40a of FIG. 5 can be varied with output power, $P_{out}$, in the first preferred embodiment of the invention. It will be seen that the variation in the resistance R1 follows $$\left(\frac{\partial P_{out}}{\partial V_{bias}}\right)^{-1}$$

in an approximate fashion. More particularly, in this example the applied function is smoothed compared to the actual pattern of variation in $$\left(\frac{\partial P_{out}}{\partial V_{bias}}\right)^{-1},$$

so as to be piecewise linear.

In fact, in certain applications it may not be necessary for the variation in gain of integration to follow $$\left(\frac{\partial P_{out}}{\partial V_{bias}}\right)^{-1}$$

throughout the whole output power range of the power amplifier. It may be possible to bring the performance of the power amplifier within specification simply by varying the gain of integration according to $$\left(\frac{\partial P_{out}}{\partial V_{bias}}\right)^{-1}$$

within a portion of the range of the amplifier's output power (e.g. at high output power values).

At high output power levels, the architecture according to the first preferred embodiment of the invention produces a marked improvement (up to around 10°) in phase margin as compared to the architecture of a comparative example in which integrator gain is fixed.

Figure 7:
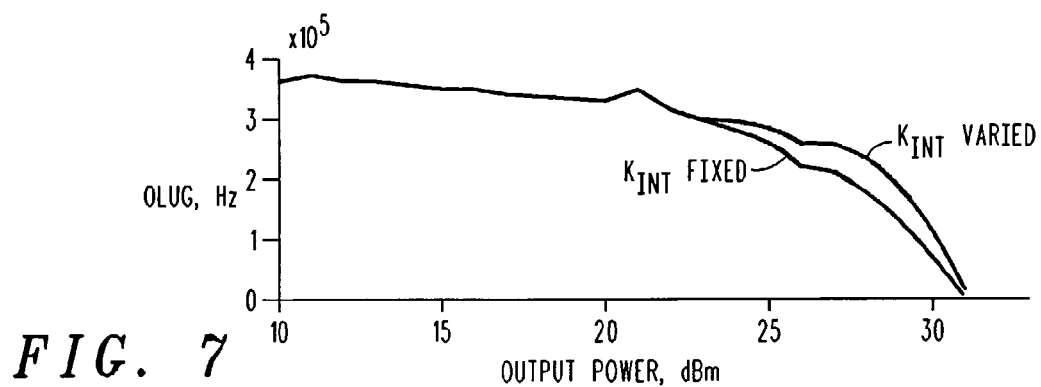
FIG. 7 is a graph showing how open loop unity gain varies with output power of a BCM RF power amplifier architecture according to the first preferred embodiment of the invention and a comparative example.

FIG. 7 illustrates how embodiments of the present invention reduce the variation in power amplifier open loop unity gain (OLUG) that is generally seen in conventional BCM power amplifier architectures. In FIG. 7, first and second traces represent, respectively, the variation in OLUG with output power for a BCM RF power amplifier architecture according to the comparative example (having fixed integrator gain) and the variation in OLUG with output power for a BCM RF power amplifier architecture according to the first preferred embodiment of the invention.

It can be seen from FIG. 7 that the architecture according to the first preferred embodiment of the invention is better than the architecture of the comparative example at maintaining the open loop unity gain observed at high output power levels close to its level at lower power output levels. This increases the dynamic range of the loop and therefore makes it easier to implement a loop that is stable and compliant with the user specifications.

Figure 8:
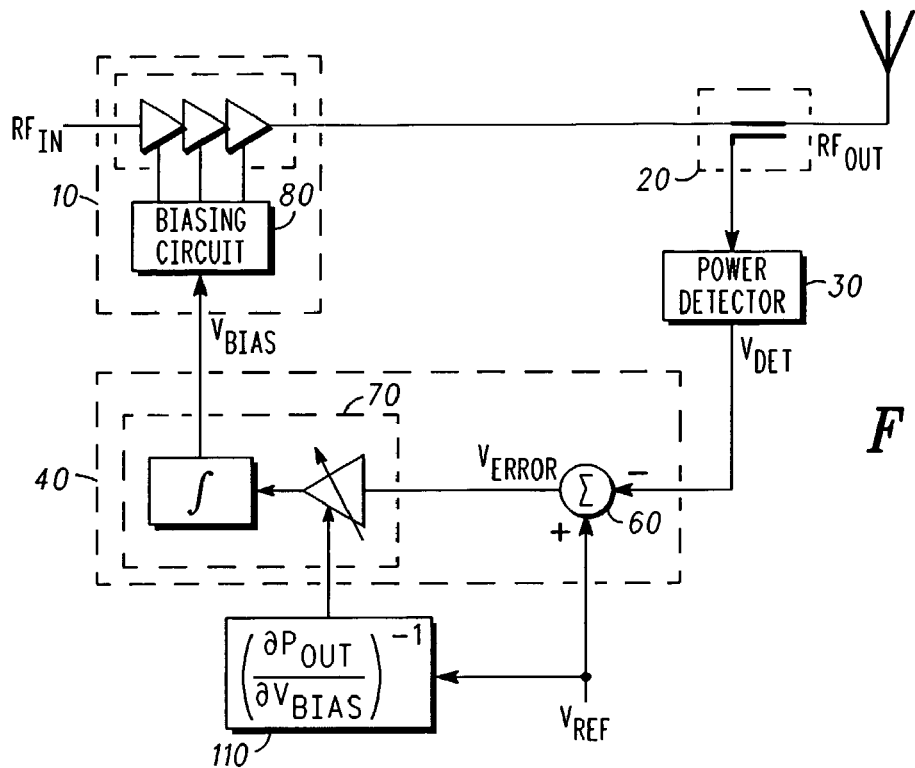
FIG. 8 is a block diagram schematically representing a BCM RF power amplifier architecture according to the invention in which a first approach is used to control the integrator gain.
Figure 9:
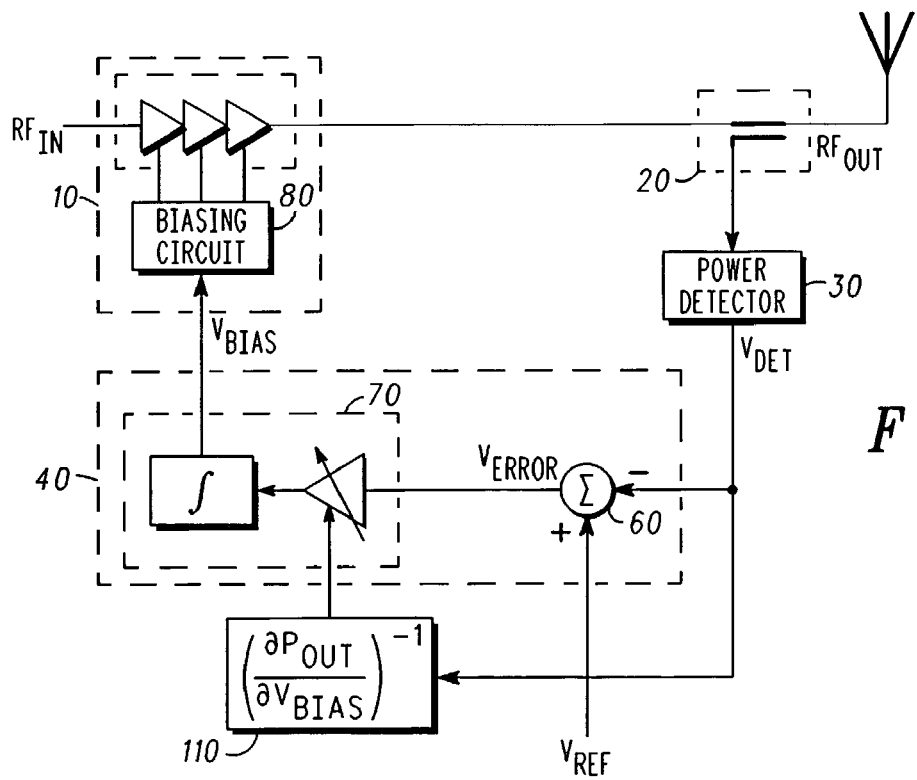
FIG. 9 is a block diagram schematically representing a BCM RF power amplifier architecture according to the invention in which a second approach is used to control the integrator gain.

FIGS. 8 and 9 illustrate two different approaches for exercising dynamic control over the gain applied by the integrator 70 of the bias control circuit 40 (whether the integrator 70 is implemented within an operational-amplifier-based differential integrator structure 40a as in FIG. 5 or using some other structure). In the examples illustrated in FIGS. 9 and 10, a control module 110 is used to determine what is the present value of the function $$K_x\left(\frac{\partial P_{out}}{\partial V_{bias}}\right)^{-1}.$$

The control module 110 then controls the gain of the integrator 70 based on the determined value.

In the example illustrated in FIG. 8, the control module 110 receives the signal $V_{ref}$ as an input. Control module 110 treats the current $V_{ref}$ value as an estimate of the current value of $P_{out}$ and, since the curve relating $P_{out}$ and $V_{bias}$ is known, control module 110 can determine what is the slope $$\left(\frac{\partial P_{out}}{\partial V_{bias}}\right)$$

of that curve at the location where $P_{out}$ corresponds to $V_{ref}$ (bearing in mind that $V_{ref}$ may be some scaled version of the desired output power, rather than precisely equal to the desired output power). Accordingly, the control module 110 can determine a value for the function $$K_x\left(\frac{\partial P_{out}}{\partial V_{bias}}\right)^{-1}$$

and controls the gain of the integrator 70 according to this function.

Since the loop is locked, the approach illustrated in FIG. 8 is relatively simple to implement, even though the control is exercised based on what $P_{out}$ should be at a given time, rather than on a direct measurement of $P_{out}$.

By way of contrast, in the example illustrated in FIG. 9, the control module 110 receives the signal $V_{det}$ as an input $V_{det}$ being a more direct measurement of the present value of $P_{out}$. Once again, the control module 110 can determine what is the slope $$\left(\frac{\partial P_{out}}{\partial V_{bias}}\right)$$

of the $P_{out}/V_{bias}$ curve at the location where $P_{out}$ corresponds to the output power represented by the value of $V_{det}$ at this time. Accordingly, the control module 110 can determine a value for the function $$K_x\left(\frac{\partial P_{out}}{\partial V_{bias}}\right)^{-1}$$

and controls the gain of the integrator 70 according to this function.

This second approach illustrated in FIG. 9 has a double feedback path and this increases the complexity of the loop design.

Although the invention has been described above with reference to preferred embodiments thereof, the skilled person will readily understand that the present invention is not limited by the particularities of the above-described embodiments. More particularly, changes and developments may be made to the above-described preferred embodiments without departing from the scope of the present invention as defined in the accompanying claims.

For example, although the above-described preferred embodiments of the invention make use of an operational-amplifier-based differential amplifier structure, the skilled person will readily understand that other configurations can be used, provided that the functions of comparison and integration (with variable gain of integration) are provided.

Moreover, although the above-described preferred embodiments of the invention illustrate two particular approaches for controlling the variation in the gain of integration of an differential integrator circuit in the BCM loop, the skilled person will readily understand that the desired variation in the gain of integration can be controlled in other ways, for example, a look-up table could be used storing the value of $$K_x \left( \frac{\partial P_{out}}{\partial V_{bias}} \right)^{-1}$$

to apply for a given value of $V_{ref}$ or $V_{det}$.

The invention claimed is:

1. A method of controlling the output power of an RF power amplifier, comprising the steps of:
   providing a bias control feedback loop arranged to determine the level of the power output by the amplifier and to control the biasing of the amplifier based on the determined power level, said bias control feedback loop including means for comparing the output power level with a reference value to produce an error signal and for integrating the error signal; and
   dynamically varying the gain of integration, applied by the comparing and integrating means, by modulating the gain of integration using a modulating function comprising a function approximately inverse to $$\left( \frac{\partial P_{out}}{\partial V_{bias}} \right),$$

wherein $P_{out}$ is the output power of the power amplifier and $V_{bias}$ is the bias voltage applied to the power amplifier by the bias control loop.

2. A method of controlling the output power of an RF power amplifier, according to claim 1, wherein said modulating function comprises a piecewise linear function approximately inverse to $$\left( \frac{\partial P_{out}}{\partial V_{bias}} \right).$$

3. A method of controlling the output power of an RF power amplifier, according to claim 1, wherein said function approximately inverse to $$\left( \frac{\partial P_{out}}{\partial V_{bias}} \right)$$

constitutes a portion of said modulating function, said portion of the modulating function corresponding to a portion of the range of the amplifier's output power.

4. A method of controlling the output power of an RF power amplifier, according to claim 1, wherein the providing step comprises the step of providing an operational-amplifier-based differential integrator and the step of varying the gain of integration comprises varying the input resistance to said differential integrator.

5. A method of controlling the output power of an RF power amplifier, according to claim 1, and comprising the step of providing control means for determining, based on the value of the reference signal the value of said function approximately inverse to $$\left( \frac{\partial P_{out}}{\partial V_{bias}} \right).$$

6. A method of controlling the output power of an RF power amplifier, according to claim 1, and comprising the step of providing control means for determining, based on a sampled value representative of the amplifier output power, the value of said function approximately inverse to $$\left( \frac{\partial P_{out}}{\partial V_{bias}} \right).$$

7. An RF power amplifier comprising:
   a bias control feedback loop, the bias control loop including means for comparing the output power level with a reference value to produce an error signal and for integrating the error signal;
   control means adapted, in use, to vary the gain of integration of the comparing and integrating means, depending on the present level of output power, by modulating the gain of integration using a modulating function comprising a function approximately inverse to $$\left( \frac{\partial P_{out}}{\partial V_{bias}} \right),$$

wherein $P_{out}$ is the output power of the power amplifier and $V_{bias}$ is the bias voltage applied to the power amplifier by the bias control loop.

8. An RF power amplifier according to claim 7, wherein the control means is adapted, in use, to apply a modulating function comprising a piecewise linear function approximately inverse to $$\left( \frac{\partial P_{out}}{\partial V_{bias}} \right).$$

9. An RF power amplifier according to claim 7, wherein the control means is adapted, in use, to apply a modulating function having a portion constituted by said function approximately inverse to $$\left(\frac{\partial P_{out}}{\partial V_{bias}}\right),$$

said portion of the modulating function corresponding to a portion of the range of the amplifier's output power.

10. An RF power amplifier according to claim 7, wherein the comparing and integrating means comprises an operational-amplifier-based differential integrator and the control means is adapted to vary the gain of said differential integrator by varying the input resistance thereto.

11. An RF power amplifier according to claim 7, wherein the control means is adapted to determine the value of said function approximately inverse to $$\left(\frac{\partial P_{out}}{\partial V_{bias}}\right)$$

based on the value of the reference signal.

12. An RF power amplifier according to claim 7, wherein the control means is adapted to determine the value of said function approximately inverse to $$\left(\frac{\partial P_{out}}{\partial V_{bias}}\right)$$

based on a sampled value representative of the amplifier output power.

13. An RF transmitter comprising a power amplifier according to claim 7.

14. A method of controlling the output power of an RF power amplifier, comprising the steps of:
   determining the level of the power output by the amplifier;
   controlling the biasing of the amplifier based on the determined power level;
   comparing the output power level with a reference value to produce an error signal and for integrating the error signal; and
   dynamically varying the gain of integration by modulating the gain of integration using a modulating function comprising a function approximately inverse to $$\left(\frac{\partial P_{out}}{\partial V_{bias}}\right),$$

wherein $P_{out}$ is the output power of the power amplifier and $V_{bias}$ is the bias voltage applied to the power amplifier.

15. A method of controlling the output power of an RF power amplifier according to claim 14, wherein said modulating function comprises a piecewise linear function approximately inverse to $$\left(\frac{\partial P_{out}}{\partial V_{bias}}\right).$$

16. A method of controlling the output power of an RF power amplifier, according to claim 14, wherein said function approximately inverse to $$\left(\frac{\partial P_{out}}{\partial V_{bias}}\right)$$

constitutes a portion of said modulating function, said portion of the modulating function corresponding to a portion of the range of the amplifier's output power.

17. A method of controlling the output power of an RF power amplifier, according to claim 14 wherein the step of varying the gain of integration comprises varying the input resistance to an operational-amplifier-based differential integrator.

18. A method of controlling the output power of an RF power amplifier, according to claim 14 and comprising the step of determining, based on the value of the reference signal, the value of said function approximately inverse to $$\left(\frac{\partial P_{out}}{\partial V_{bias}}\right).$$

19. A method of controlling the output power of an RF power amplifier, according to claim 14 and comprising the step of determining, based on a sampled value representative of the amplifier output power, the value of said function approximately inverse to $$\left(\frac{\partial P_{out}}{\partial V_{bias}}\right).$$

20. A method of controlling the output power of an RF power amplifier, according to claim 15, wherein said function approximately inverse to $$\left(\frac{\partial P_{out}}{\partial V_{bias}}\right)$$

constitutes a portion of said modulating function, said portion of the modulating function corresponding to a portion of the range of the amplifier's output power.

* * * * *